US012791380B2

(12) United States Patent
King et al.

(10) Patent No.: US 12,791,380 B2
(45) Date of Patent: Nov. 10, 2026

(54) DETECTION DEVICE COMPRISING ENERGY SENSING PADS, N-TYPE TRANSISTORS, AND P-TYPE TRANSISTORS, AND METHOD FOR OPERATING A DETECTION DEVICE

(71) Applicants: TAIWAN SEMICONDUCTOR MANUFACTURING COMPANY, LTD., Hsinchu (TW); NATIONAL TSING HUA UNIVERSITY, Hsinchu City (TW)

(72) Inventors: Ya-Chin King, Taipei City (TW); Chrong Jung Lin, Hsinchu City (TW); Burn Jeng Lin, Hsinchu City (TW); Ting-Kai Huang, Taichung City (TW); Wei Chang, New Taipei City (TW)

(73) Assignees: TAIWAN SEMICONDUCTOR MANUFACTURING COMPANY, LTD., Hsinchu (TW); NATIONAL TSING HUA UNIVERSITY, Hsinchu City (TW)

( * ) Notice: Subject to any disclaimer, the term of this patent is extended or adjusted under 35 U.S.C. 154(b) by 350 days.

(21) Appl. No.: 18/518,952

(22) Filed: Nov. 24, 2023

(65) Prior Publication Data

US 2025/0172520 A1 May 29, 2025

(51) Int. Cl.

*G01J 1/42* (2006.01)
*G01N 27/12* (2006.01)
*G03F 7/00* (2006.01)

(52) U.S. Cl.

CPC .............. *G01J 1/429* (2013.01); *G01N 27/12* (2013.01); *G03F 7/70441* (2013.01); *G03F 7/706837* (2023.05)

(58) Field of Classification Search

CPC ...................................................... G01J 1/429

(Continued)

(56) References Cited

U.S. PATENT DOCUMENTS 10,498,980 B2 * 12/2019 Ohmaru ............... H04N 25/532
11,824,133 B2 * 11/2023 King ..................... H10F 77/206

(Continued)

FOREIGN PATENT DOCUMENTS

TW 202201589 A 1/2022
TW 202320352 A 5/2023
WO 2022018452 A1 1/2022

OTHER PUBLICATIONS

Ziqing Li et al., Low-dimensional wide-bandgap semiconductors for UV photodetectors, Nature Reviews Materials, vol. 8, 587-603 (Year: 2023).*

(Continued)

*Primary Examiner* — Allen C. Ho
(74) *Attorney, Agent, or Firm* — Maschoff Brennan

(57) ABSTRACT

A method includes applying a first voltage to a source of a first transistor of a detection unit of a semiconductor detector in a test wafer and applying a second voltage to a gate of the first transistor and a drain of a second transistor of the detection unit. The first transistor is coupled to the second transistor in series, and the first voltage is higher than the second voltage. A pre-exposure reading operation is performed to the detection unit. Light of an exposure apparatus is illuminated to a gate of the second transistor after applying the first and second voltages. A post-exposure reading operation is performed to the detection unit. Data of the pre-exposure reading operation is compared with the post-exposure reading operation. An intensity of the light is adjusted based on the compared data of the pre-exposure reading operation and the post-exposure reading operation.

20 Claims, 13 Drawing Sheets

(58) Field of Classification Search
USPC ........................................................ 250/338.4
See application file for complete search history.

(56) References Cited

U.S. PATENT DOCUMENTS

| | | | | |
|---|---|---|---|---|
| 12,009,177 | B2 * | 6/2024 | King .................. | H01J 37/3002 |
| 12,426,317 | B2 * | 9/2025 | Hwu .................... | H10D 48/383 |
| 2023/0343859 | A1 | 10/2023 | Hwu et al. | |

OTHER PUBLICATIONS

Kazuo Nakazato, "An Integrated ISFET Sensor Array", Sensors 9.11 (Nov. 2009), pp. 8831-8851.
Lei Shi et al., "Stability Characterization of High-Sensitivity Silicon-Based EUV Photodiodes in a Detrimental Environment", IEEE Sensors Journal, vol. 13, No. 5, pp. 1699-1707 (May 2013).
Robert A. Stern et al., "EUV and Soft X-Ray Quantum Efficiency Measurements of a Thinned Back-Illuminated CMOS Active Pixel Sensor", IEEE Electron Device Letters, vol. 32, No. 3, pp. 354-356 (Mar. 3, 2011).
Wei-Hwa Lin et al., "2T-Pixel Sensors Array for on-Wafer in-Chamber DUV Sensing", 2022 International Symposium on VLSI Technology, Systems and Applications (VLSI-TSA), 2022, pp. 1-2, doi: 10.1109/VLSI-TSA54299.2022.9771024. Apr. 2022.

* cited by examiner

DETECTION DEVICE COMPRISING ENERGY SENSING PADS, N-TYPE TRANSISTORS, AND P-TYPE TRANSISTORS, AND METHOD FOR OPERATING A DETECTION DEVICE

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

As the size has decreased, maintaining the reliability in patterning processes and the yields produced by the patterning processes has become more difficult. In some cases, the use of optical proximity correction and the adjustment of lithography parameters such as the duration of a process, the wavelength, focus, and intensity of light used can mitigate some defects. However, the current and systems for patterning material layers in semiconductor wafers has not been entirely satisfactory.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
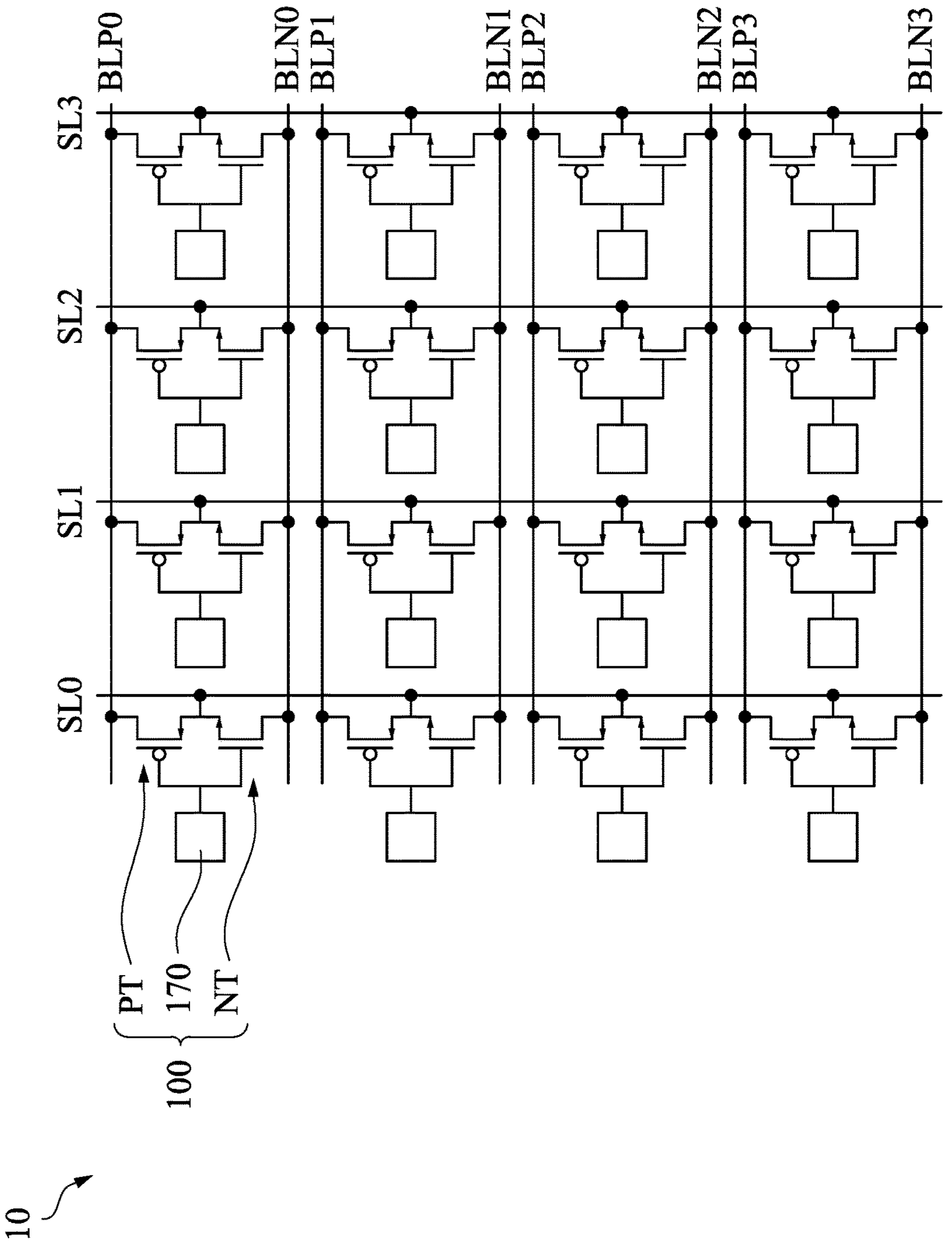
FIG. 1A is a circuit diagram of a detection device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, “around,” “about,” “approximately,” or “substantially” shall generally mean within 20 percent, or within 10 percent, or within 5 percent of a given value or range. Numerical quantities given herein are approximate, meaning that the term “around,” “about,” “approximately,” or “substantially” can be inferred if not expressly stated.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

The present disclosure is related to a detection device and a method of operating the same. More particularly, some embodiments of the present disclosure are related to high-density and powerless detection devices for extreme ultra-violet (EUV) light, deep ultraviolet (DUV) light, electron beam (e-beam), gas, plasma, and/or ions in a solution. In some embodiments, the detection device may be realized on the device including planar devices, multi-gate devices, FinFETs, nanosheet-gate FETs, and gate-all-around FETs.

FIG. 1A is a circuit diagram of a detection device 10 according to some embodiments of the present disclosure. The detection device 10 may include plural detection units 100, bit lines BLP0-BLP3, bit lines BLN0-BLN3, source lines SL0-SL3. The detection units 100 are arrayed. Each of the detection units 100 may be coupled with one of the bit lines BLP0-BLP3, one of the bit lines BLN0-BLN3, and one of the source lines SL0-SL3. Each of the detection units 100 includes a n-type transistor NT, a p-type transistor PT, and an energy sensing pad 170, for detecting light intensity. The n-type transistor NT may be a n-type metal oxide semiconductor (NMOS) field effect transistor (FET). The p-type transistor PT may be a p-type metal oxide semiconductor (PMOS) FET. The n-type transistor NT is connected/coupled with the p-type transistor PT. In some embodiments, the bit lines BLP0-BLP3 and BLN0-BLN3 are staggered parallel to each other, and the bit lines BLP0-BLP3 and BLN0-BLN3 may extend along a direction different from a direction that the source lines SL0-SL3 extend along. For example, in FIG. 1A, the bit lines BLP0-BLP3 and BLN0-BLN3 extend substantially along a row direction, while the source lines SL0-SL3 extend substantially along a column direction substantially perpendicular to the row direction. It is noted that though the array of the detection units 100 is illustrated as four columns and rows, the array of the detection units 100 can be arranged to have any suitable numbers of the columns and rows.

Figure 1B:
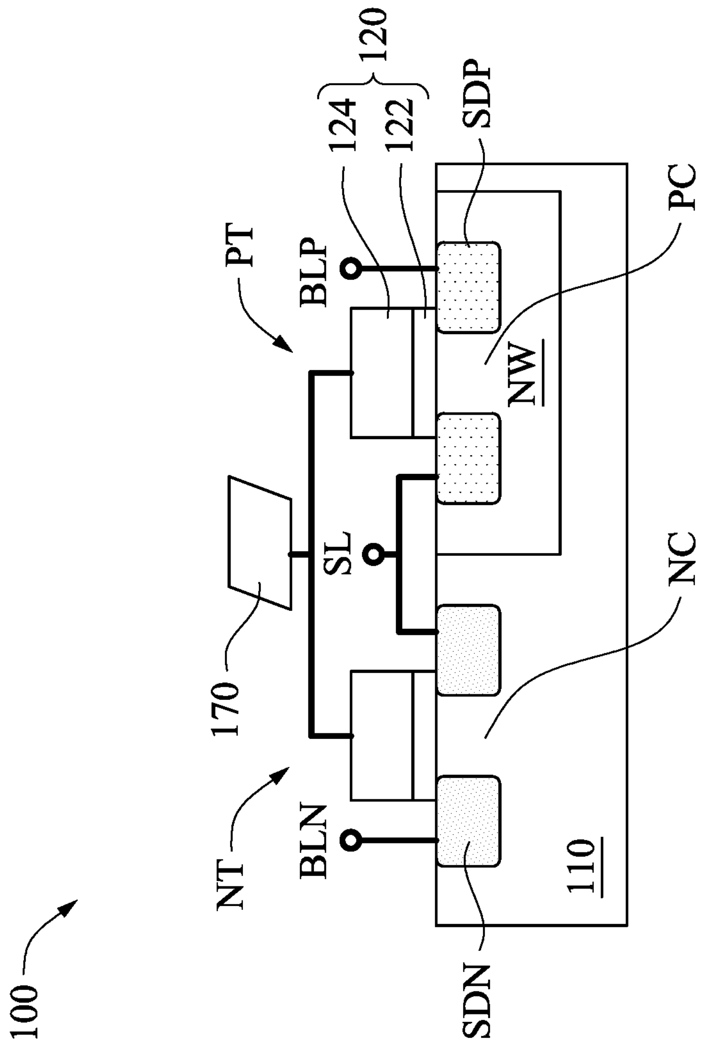
FIG. 1B is schematic cross-sectional view of a detection unit in FIG. 1A.

FIG. 1B is schematic cross-sectional view of a detection unit 100 in FIG. 1A. The n-type transistor NT and the p-type transistor PT are formed over a semiconductor substrate 110. The n-type transistor NT includes a channel region NC, a gate structure 120 over the channel region NC, and source/drain regions SDN on opposite sides of the channel region NC. The p-type transistor PT includes a channel region PC, a gate structure 120 over the channel region PC, and source/drain regions SDP on opposite sides of the channel region PC. The channel region PC/NC may be a portion of the semiconductor substrate 110 or semiconductor materials deposited over the semiconductor substrate 110. The gate structure 120 may include a gate dielectric 122 over the channel region PC/NC and a gate electrode 124 over the gate dielectric 122. In some embodiments, the semiconductor substrate 110 is p-type substrate doped to have a n-type doped well NW, the p-type transistor PT is over the n-type doped well NW, and the n-type transistor NT is over the p-type substrate away from the n-type doped well NW.

Reference is made to FIGS. 1A and 1B. For each of the detection units 100, gates of the n-type transistor NT and the p-type transistor PT (e.g., gate electrode 124 of the n-type transistor NT and the p-type transistor PT) are electrically connected to the same energy sensing pad 170, source/drain nodes of the p-type transistor PT (e.g., source/drain regions SDP of the p-type transistor PT) are respectively coupled to one of the bit lines BLP0-BLP3 and one of the source lines SL0-SL3, and source/drain nodes of the n-type transistor NT (e.g., source/drain regions SDN of the n-type transistor NT) are respectively coupled to the one of the bit lines BLN0-BLN3 and said one of the source lines SL0-SL3. In this configuration, for each of the detection units 100, the gates of the n-type transistor NT and the p-type transistor PT (e.g., gate electrode 124 of the n-type transistor NT and the p-type transistor PT) are electrically coupled with each other. And, for each of the detection units 100, being connected with said one of the source lines SL0-SL3, one of the source/drain nodes of the p-type transistor PT (e.g., source/drain regions SDP of the p-type transistor PT) is electrically coupled with one of the source/drain nodes of the n-type transistor NT (e.g., source/drain regions SDN of the n-type transistor NT).

In some embodiments, the energy sensing pad 170 may receive external energy (e.g., EUV light, DUV light, e-beams), and generate the electrical charges (e.g., electrons) upon the external energy. In some embodiments, for detecting lights and e-beams, the gate electrodes 124 of the n-type transistor NT and the p-type transistor PT may serve as floating gates, which are signal storage nodes that store these electrical charges generated by the energy sensing pad 170. The amounts of the electrical charges stored in the gate electrodes 124 may influence the threshold voltage ($V_T$) of the n-type transistor NT and the p-type transistor PT.

In some embodiments, the energy sensing pad 170 may interact with substance (e.g., gas, plasma, and/or ions in a solution), and change the resistance upon the interaction with the substance (e.g., gas, plasma, and/or ions in a solution). As a result, after exposing the energy sensing pad 170 to the substance, the electrical characteristic of the transistors NT/PT may reflect a level/degree of characteristics of the external energy/substance (e.g., a light intensity and a exposure time of EUV light, a light intensity and a exposure time of DUV light, an intensity and an exposure time of e-beam, a concentration of gas, an amount of plasma charging inductive charge of plasma, and/or a ion concentration of ions in the solution). By comparing the electrical characteristic of the transistors NT/PT before and after exposing the energy sensing pad 170 to the external energy/substance, the level/degree of the characteristics of the external energy/substance can be determined. For example, by comparing a current flow through the transistor NT/PT before and after exposing the energy sensing pad 170 to the external energy, the level/degree of the characteristics of the external energy/substance can be determined. In some embodiments, through the array of the detection units 100, a distribution of level/degrees of characteristics of the external energy/substance can be determined, and a uniformity of the external energy/substance can also be determined.

Figure 1C:
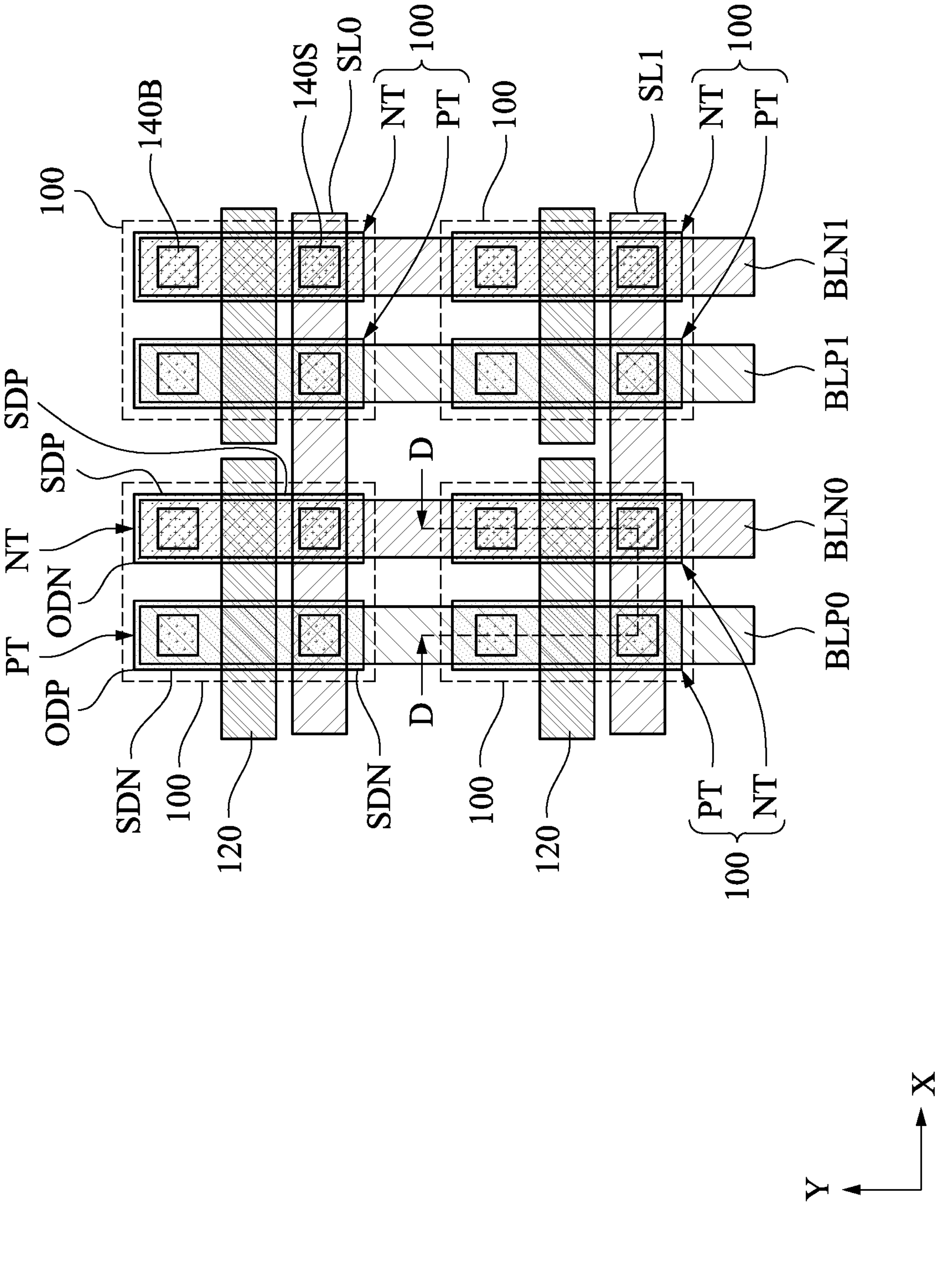
FIG. 1C is a layout of a detection device including plural detection units according to some embodiments of the present disclosure.
Figure 1D:
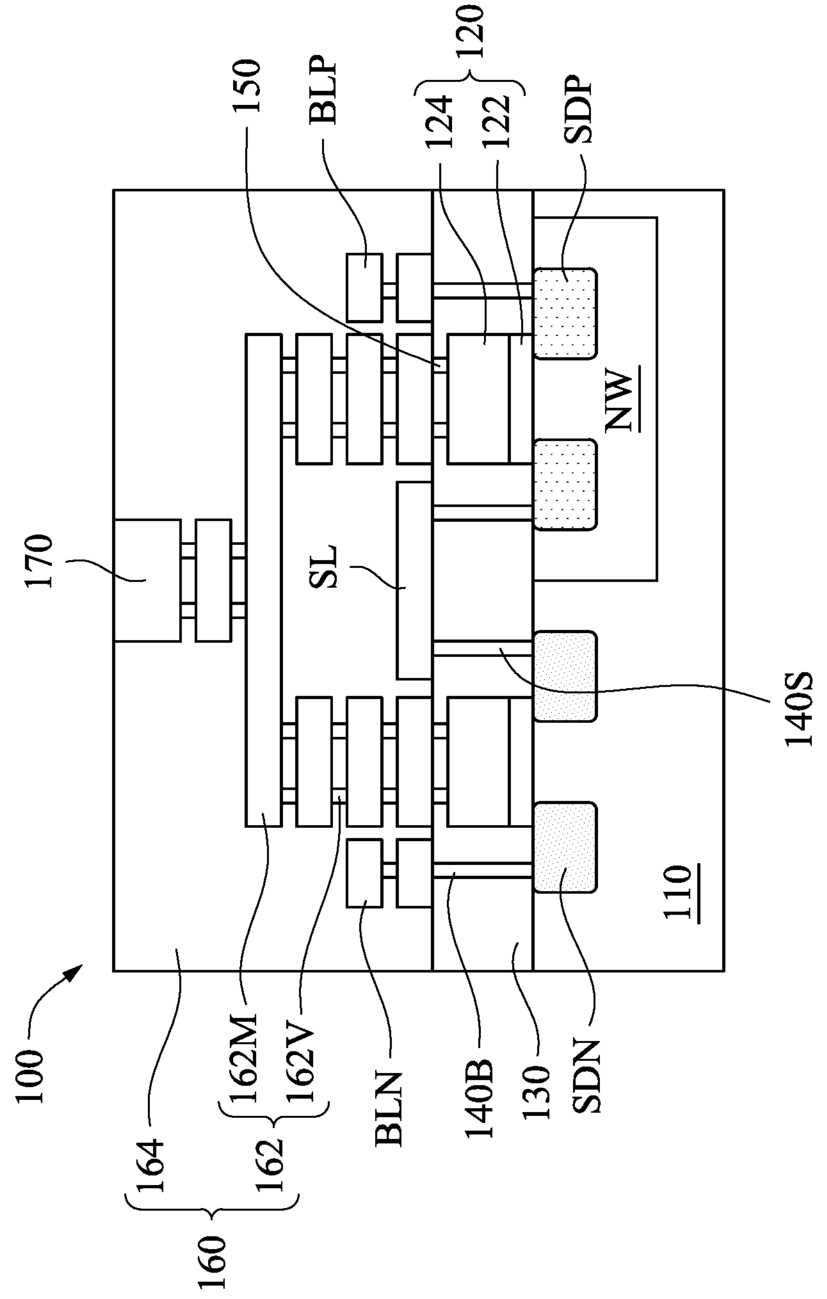
FIG. 1D is an exemplary cross-sectional view of the detection unit taken along line D-D in FIG. 1C.

FIG. 1C is a layout of a detection device 10 including plural detection units 100 according to some embodiments of the present disclosure. FIG. 1C may also serve as a top view of the detection device 10. FIG. 1D is an exemplary cross-sectional view of the detection unit 100 taken along line D-D in FIG. 1C. Isolation regions (not shown) are formed over the semiconductor substrate 110 for defining plural active regions ODN and ODP. The isolation regions may be formed by etching trenches defining the active regions ODN and ODP in the semiconductor substrate 110, depositing one or more dielectric materials (e.g., silicon oxide) to fill the trenches around the active regions ODN and ODP. In some embodiments, the isolation regions may be further recessed and be referred to as shallow trench isolations (STI) defining fin-like active regions.

Gate structure 120 are formed over the semiconductor substrate 110 and across the active regions ODN and ODP. The gate structure 120 may include a gate dielectric 122 and a gate electrode 124 over the gate dielectric 122. The gate dielectric 122 includes, for example, a high-k dielectric material such as oxides and/or silicates of metals (e.g., oxides and/or silicates of Hf, Al, Zr, La, Mg, Ba, Ti, and other metals), silicon nitride, silicon oxide, and the like, or combinations thereof, or multilayers thereof. In some embodiments, the gate electrode 124 may be suitable conductive material, such as polysilicon or metal. In some embodiments, the gate electrode 124 may be a multilayered metal gate stack comprising a barrier layer, a work function layer, and a gate-fill layer formed successively on top of gate dielectric layer 132. Example materials for a barrier layer include TiN, TaN, Ti, Ta, or the like, or a multilayered combination thereof. A work function layer may include TiN, TaN, Ru, Mo, Al, for a p-type FET, and Ti, Ag, TaAl, TaAlC, TiAlN, TaC, TaCN, TaSiN, Mn, Zr, for an n-type FET. Other suitable work function materials, or combinations, or multilayers thereof may be used. The gate-fill layer may comprise metals such as Cu, Al, W, Co, Ru, or the like, or combinations thereof, or multi-layers thereof.

Source/drain regions SDN/SDP are formed by heavily doping regions of the semiconductor substrate. In some embodiments, the source/drain regions SDN/SDP may comprise an epitaxially grown region. The source/drain regions SDN may be doped with n-type dopants, such as phosphorus, arsenic, and the source/drain regions SDP may be doped with the p-type dopants, such as boron, $BF_2$, gallium.

Once the source/drain regions SDN/SDP are formed, an interlayer dielectric (ILD) layer 130 is deposited over the source/drain regions SDN/SDP. The ILD layer 130 may comprise silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The ILD layer 130 may be deposited using any suitable method, such as CVD, PVD, ALD, PEALD, PECVD, SACVD, FCVD, spin-on, and/or the like, or a combination thereof. In some embodiments, a contact etch stop layer (CESL) (not shown) of a suitable dielectric (e.g., silicon nitride, silicon carbide, or the like, or a combination thereof) may be deposited prior to depositing the ILD layer 130.

Contact plugs 140B, 140S, and 150 may be formed in the ILD layer 130 using photolithography, etching and deposition techniques. For example, a patterned mask may be formed over the ILD layer 130 and used to etch openings that extend through the ILD layer 130 to expose the gate structure 120 as well as the source/drain regions SDN/SDP. Thereafter, conductive material(s) may be formed in the openings in the ILD layer 130. The conductive material(s) may include W, Al, Cu, Ru, Ni, Co, alloys of these, combinations thereof, and the like. In some embodiments, the Contact plugs 140B and 140S may include metal silicides between the conductive material(s) and the source/drain regions SD. Next, a planarization process (e.g., CMP) may be used to remove excess portions of all the conductive materials from over the surface of the ILD layer 130. The resulting conductive plugs extend into the ILD layer 130 and constitute contact plugs 140B, 140S, and 150 making physical and electrical connections to the gates or source/drain nodes of electronic devices.

A multilayer interconnect (MLI) structure 160 is disposed over the semiconductor substrate 110. The MLI structure 160 includes various conductive features 162 and a dielectric structure 164 surrounding the conductive features 162. The conductive features 162 may include vertical interconnects, such as metal vias 162V, and/or horizontal interconnects, such as lines 162M. The various conductive features 162 include conductive materials, such as aluminum, titanium, titanium nitride, tungsten, polysilicon, copper, metal silicide copper, copper alloy, tantalum, tantalum nitride, or combinations thereof. The various conductive features 162 may be formed by a process including physical vapor deposition (PVD), chemical vapor deposition (CVD), or combinations thereof. Other manufacturing techniques to form the conductive features 162 may include photolithography processing and etching to pattern conductive materials to form the vertical and horizontal connects. The MLI structure 160 may include any number, material, size, and/or dimension of conductive features depending on design requirements of the integrated circuit device 200.

Some of the lines 162M of the MLI structure 160 may serve as the bit lines BLP (e.g., bit lines BLP0-BLP1 in FIG. 1C), the bit lines BLN (e.g., bit lines BLN0-BLN1 in FIG. 1C) and the source lines SL (e.g., bit lines SL0-SL1 in FIG. 1C) in the detection device 10. In FIG. 1C, a 2×2 array of the detection units 100 is illustrated. In some embodiments, the bit lines BLP0-BLP1 and BLN0-BLN1 may extend along a direction different from a direction that the source lines SL0-SL1 extend along. For example, in FIG. 1C, the bit lines BLP0-BLP1 and BLN0-BLN1 extend substantially along a direction Y, while the source lines SL0-SL1 extend substantially along a direction X substantially perpendicular to the direction Y. In the present embodiments, the gate structure 120 may extend along a direction the same as that of the source lines SL0-SL1. For example, the gate structure 120 may extend along the direction X.

The MLI structure 160 includes the energy sensing pad 170 electrically coupled to the gate electrode 124 of the n-type transistor NT and the gate electrode 124 of the p-type transistor PT. The energy sensing pad 170 may made of suitable material that is capable of receiving external energy/substance and generating electrical charges according to the received external energy/substance. The energy sensing pad 170 may be made of a material different from that of the conductive features 162. For example, the energy sensing pad 170 may be made of a metal having a work function different from that of the conductive features 162. In some embodiments, the energy sensing pad 170 is exposed from the MLI structure 160 for convenience of sensing. In some examples, the energy sensing pad 170 may be higher than topmost lines 162M of the conductive features 162 or at a same level as topmost lines 162M of the conductive features 162.

The dielectric structure 164 may surround the conductive features 162 and the energy sensing pad 170. The dielectric structure 164 may include plural ILD layers and plural etch stop layers between adjacent ILD layers. The ILD layer may comprise silicon oxide, PSG, BSG, BPSG, USG, low-k dielectric such as, FSG, SiOCH, CDO, flowable oxide, or porous oxides (e.g., xerogels/aerogels), or the like, or a combination thereof. In some embodiments, the etch stop layer may include a different material than that of ILD layer, such as silicon nitride, silicon carbide, or the like, or a combination thereof.

Figure 2:
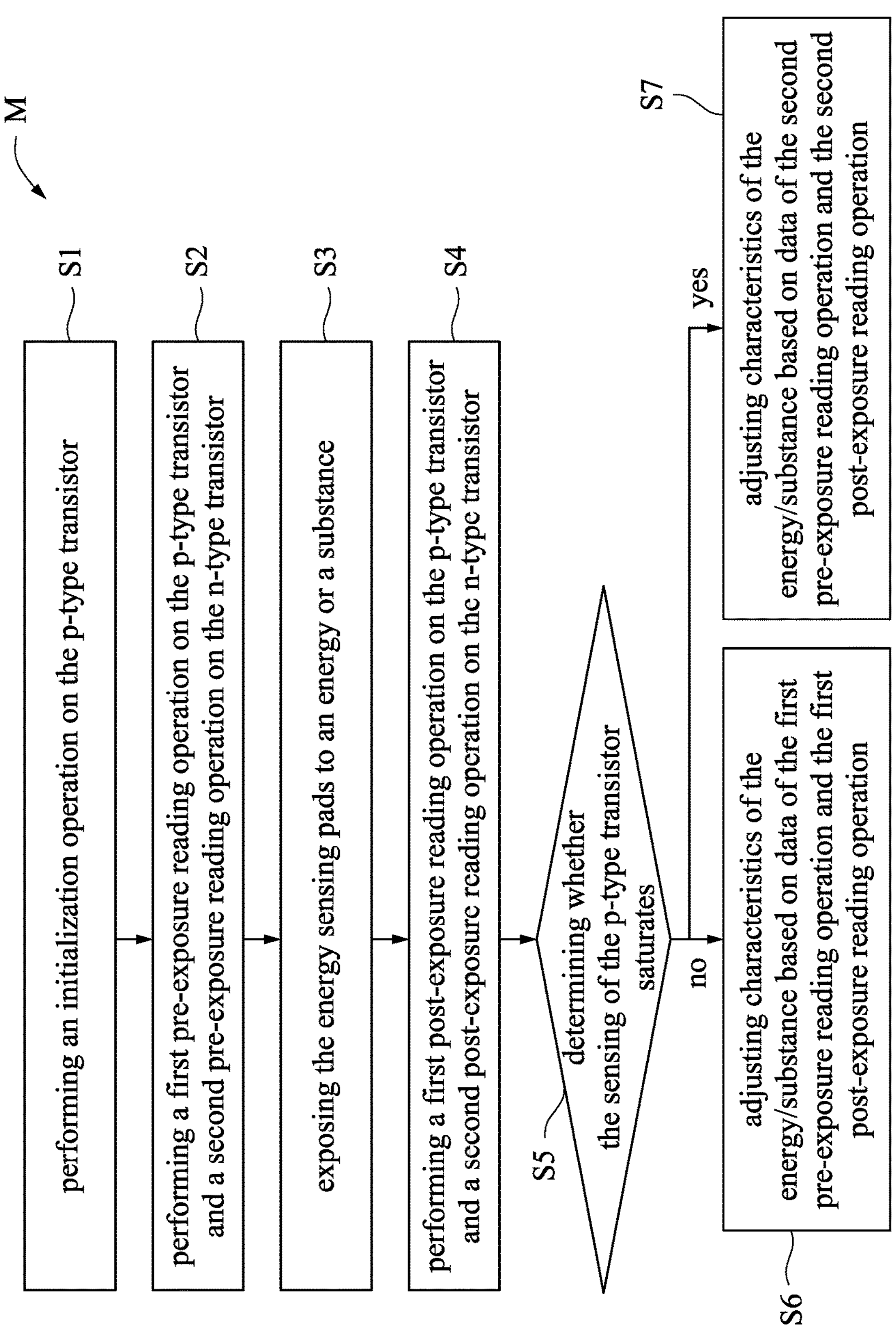
FIG. 2 is a flow chart of a method for operating a detection unit according to some embodiments of the present disclosure.

FIG. 2 is a flow chart of a method M for operating a detection unit 100 according to some embodiments of the present disclosure. The method M1 includes steps S1-S7. At step S1, an initialization operation is performed on the p-type transistor. At step S2, a first pre-exposure reading operation is performed on the p-type transistor and a second pre-exposure reading operation is performed on the n-type transistor. At step S3, the energy sensing pads is exposed to an energy or a substance. At step S4, a first post-exposure reading operation is performed on the p-type transistor and a second post-exposure reading operation is performed on the n-type transistor. At step S5, it is determined whether the sensing of the p-type transistor saturates. At step S6, if the sensing of the p-type transistor has not saturated, the characteristics of the external energy/substance is adjusted based on data of the first pre-exposure reading operation and the first post-exposure reading operation. At step S7, if the sensing of the p-type transistor has saturated, characteristics of the external energy/substance is adjusted based on data of the second pre-exposure reading operation and the second post-exposure reading operation. It is understood that additional steps may be provided before, during, and after the steps S1-S7 shown in FIG. 2, and some of the steps S1-S7 described below can be replaced or eliminated for additional embodiments of the method. The order of the operations/processes may be interchangeable.

Figure 3:
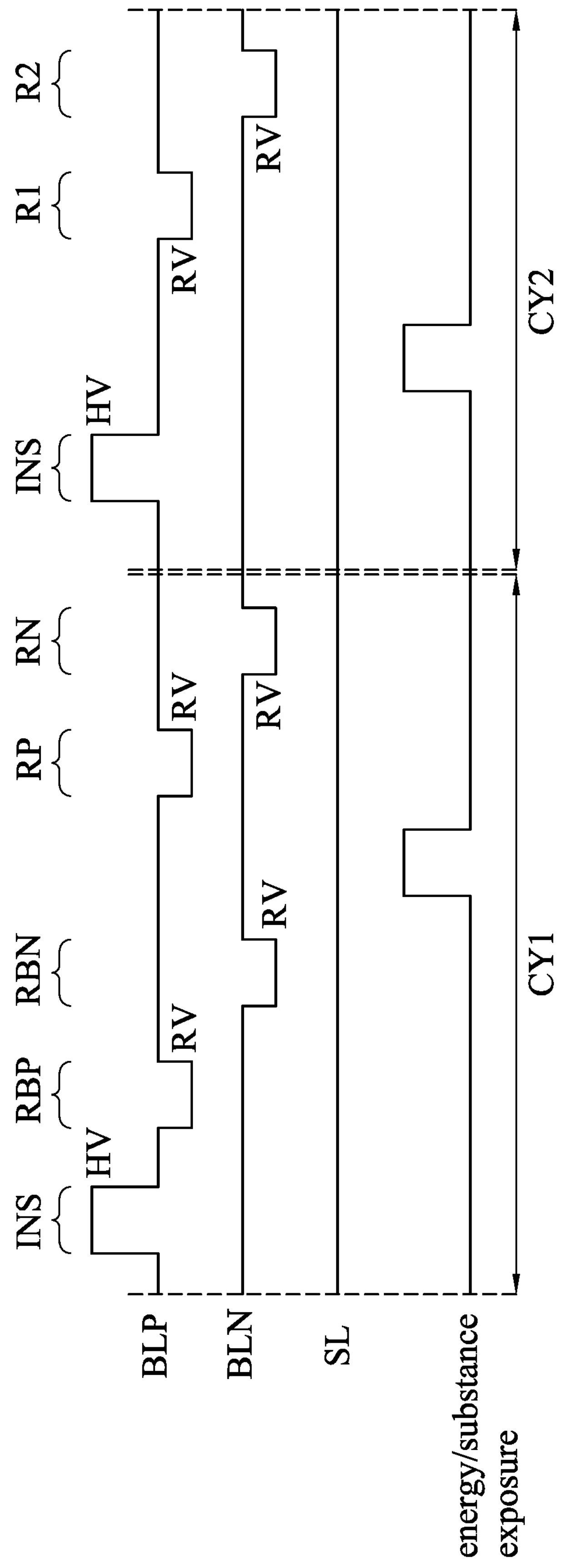
FIG. 3 is a signal sequence diagram for operating a detection unit according to some embodiments of the present disclosure.

FIG. 3 is a signal sequence diagram for operating a detection unit 100 according to some embodiments of the present disclosure. Reference is made to both FIG. 2 and FIG. 3. The method M begins at step S1, where an initialization operation INS is performed on the p-type transistor PT. The initialization operation INS may be performed by providing a high potential difference across the p-type transistor PT. For example, the initialization operation may include applying high voltages HV to a first source/drain node of the p-type transistor PT (i.e., the bit line BLP) and the well region NW, and a first source/drain node of the n-type transistor NT (i.e., the bit line BLN) and second source/drain nodes of the n-type transistor NT and the p-type transistor PT (i.e., the source line SL) are charged to about 0V (i.e., ground (GND)). Through the initialization operation INS, a channel hot hole induced hot electron injection (CHHIHEL) effect occurs and electrons are injected into the gate of the p-type transistor PT. The electrons in the gate of the p-type transistor PT will be used to detect energy (e.g., light/e-beam) or substance in the detecting cycle, which will be discussed in greater detail below. The high potential difference (e.g., the difference between the high voltage HV and ground) may be in a range of about 3.5 Volts to about 8 Volts. If the high voltage HV is lower than about 3.5 Volts, the amount of electrons in the gate of the p-type transistor PT may not be enough to detect the light intensity, or the sensitivity of the detection unit 100 is low. If the high voltage HV is higher than about 8 Volts, the detection unit 100 may be damaged.

The method M proceeds to step S2, where the pre-exposure reading operations RBP, RBN are respectively performed on the p-type transistor PT and the n-type transistor NT. In some embodiments, the pre-exposure reading operation RBP is performed prior to the pre-exposure reading operation RBN. In some alternative embodiments, the pre-exposure reading operation RBN may be performed prior to the pre-exposure reading operation RBP.

In the pre-exposure reading operation RBP, a reading voltage RV is applied to the first source/drain node of the p-type transistor PT (i.e., the bit line BLP), and the first source/drain node of the n-type transistor NT (i.e., the bit line BLN) and second source/drain nodes of the n-type transistor NT and the p-type transistor PT (i.e., the source line SL), the well region NW, and the substrate 110 below the p-type transistor PT are charged to about 0V (i.e., ground (GND)). The pre-exposure reading operation RBP determines an initial data (e.g., initial reading current) for the p-type transistor PT.

In the pre-exposure reading operation NBP, a reading voltage RV is applied to the first source/drain node of the n-type transistor NT (i.e., the bit line BLN), and the first source/drain node of the p-type transistor PT (i.e., the bit line BLP) and second source/drain nodes of the n-type transistor NT and the p-type transistor PT (i.e., the source line SL), the well region NW, and the substrate 110 below the p-type transistor PT are charged to about 0V (i.e., ground (GND)). The pre-exposure reading operation RBN determines an initial data (e.g., initial reading current) for the n-type transistor NT.

The method M then proceeds to step S3, where the energy sensing pads 170 is exposed to an energy or a substance. In the energy/substance exposure operation, the energy sensing pad 170 is exposed to energy (e.g., light/e-beam) or substance (gas mixture/plasma/ions), thereby increasing or reducing electrons stored in the gates of the n-type transistor NT and p-type transistor PT. For example, as later illustrated in FIG. 4A, the energy sensing pads 170 is exposed to the EUV/DUV light E1. For example, as later illustrated in FIG. 5A, the energy sensing pads 170 is exposed to the e-beam E2. For example, as later illustrated in FIG. 6A, the energy sensing pads 170 is exposed to the gas mixture E3, the plasma E4, and/or ions E5.

The method M then proceeds to step S4, where the post-exposure reading operations RP, RN (referring to FIG. 2) are respectively performed on the p-type transistor PT and the n-type transistor NT. In some embodiments, the post-exposure reading operation RP is performed prior to the post-exposure reading operation RN. In some alternative embodiments, the post-exposure reading operation RN may be performed prior to the post-exposure reading operation RP.

The post-exposure reading operation RP is similar to the pre-exposure reading operation RBP. For example, in the post-exposure reading operation RP, a reading voltage RV is applied to the first source/drain node of the p-type transistor PT (i.e., the bit line BLP), and the first source/drain node of the n-type transistor NT (i.e., the bit line BLN) and second source/drain nodes of the n-type transistor NT and the p-type transistor PT (i.e., the source line SL), the well region NW, and the substrate 110 below the p-type transistor PT are charged to about 0V (i.e., ground (GND)). The post-exposure reading operation RP determine a sensing data (e.g., sensing reading current) for the p-type transistor PT.

The post-exposure reading operation RN is similar to the pre-exposure reading operation RBN. For example, a reading voltage RV is applied to the first source/drain node of the n-type transistor NT (i.e., the bit line BLN), and the first source/drain node of the p-type transistor PT (i.e., the bit line BLP) and second source/drain nodes of the n-type transistor NT and the p-type transistor PT (i.e., the source line SL), the well region NW, and the substrate 110 below the p-type transistor PT are charged to about 0V (i.e., ground (GND)). The post-exposure reading operation RN determine a sensing data (e.g., sensing reading current) for the n-type transistor NT.

In some embodiments, the absolute value of the high potential difference across the p-type transistor PT provided by the initialization operation INS is greater than an absolute value of a reading potential difference between the two source/drain nodes of the p-type transistor provided by the reading operations RBP and RP (or an absolute value of a reading potential difference between the two source/drain nodes of the n-type transistor provided by the reading operations RBN and RN). For example, the high potential difference (e.g., the difference between the high voltage HV and ground) may be in a range of about 3.5 Volts to about 8 Volts, while the reading potential difference (e.g., the difference between the reading voltage RV and ground) may be in a range of about 0.5 Volts to about 1.5 Volts.

In some embodiments, a relationship of current to gate voltage of the p-type transistor PT at the reading voltage and a relationship of current to gate voltage of the n-type transistor NT at the reading voltage may be measured and obtained. Thus, the sensing reading current determined by the reading operations RP, RN, RBP, RBN at the reading voltage may correspond to the gate voltage of the p-type transistor PT and n-type transistor NT according to these relationships. Stated differently, the pre-exposure reading operation RBP determines an initial reading current for the p-type transistor PT, and may further determine an initial voltage for the gate of the p-type transistor PT, in which both the initial reading current and the initial voltage for the gate of the p-type transistor PT can be referred to as initial data obtained at pre-exposure reading operation RBP. The pre-exposure reading operation RBN determines an initial reading current for the n-type transistor NT, and may further determine an initial voltage for the gate of the n-type transistor NT, in which both the initial reading current and the initial voltage for the gate of the p-type transistor PT can be referred to as initial data obtained at pre-exposure reading operation RBN. The post-exposure reading operation RP may determine a sensing reading current for the p-type transistor PT, and further determine a voltage for the gate of the p-type transistor PT, in which both the sensing reading current and the voltage for the gate of the p-type transistor PT can be referred to as sensing data obtained at post-exposure reading operation RP. The post-exposure reading operation NP may determine a sensing reading current for the n-type transistor NT, and further determine a voltage for the gate of the n-type transistor NT, in which both the sensing reading current and the voltage for the gate of the n-type transistor NT can be referred to as sensing data obtained at post-exposure reading operation RNP.

In some embodiments, for real-time continuous detection, a cycle CY1 including the initialization operation INS, the pre-exposure reading operations RBP, RBN, the energy/substance exposure operation, and the post-exposure reading operations RP, RN, may be repeated. In some alternative embodiments, a cycle CY1 may be first performed for obtaining data of the pre-exposure reading operations RBP, RBN, and then the cycle CY2 may be repeated for real-time continuous detection. The cycle CY2 omits the pre-exposure reading operations RBP and RBN in comparison to the cycle CY1.

The method M1 proceeds to step S5, where it is determined whether the sensing of the p-type transistor NT saturates. In some embodiments, the increasing/decreasing amount of the sensing data obtained at post-exposure reading operation RP is examined with the exposure time and exposure intensity/concentration. If the increasing/decreasing amount of the sensing data obtained at post-exposure reading operation RP becomes more and more smaller as the exposure time passes, the sensing of the p-type transistor PT is considered as saturated. For example, sensing of the p-type transistor NT is considered as saturated when the changing amount of the sensing data of the p-type transistor NT per unit time under exposure becomes less than a threshold ratio of the starting changing amount of the sensing data of the p-type transistor NT per unit time under exposure. The threshold ratio may be in a range from about 5% to about 50% in some embodiments. Stated differently, the sensing of the p-type transistor NT is considered as not saturated when the changing amount of the sensing data of the p-type transistor NT per unit time under exposure is greater than the threshold ratio of the starting changing amount of the sensing data of the p-type transistor NT per unit time under exposure.

If the sensing of the p-type transistor PT has not saturated, the method M1 proceeds to step S6, where the characteristics of the external energy/substance is adjusted based on the initial data of the first pre-exposure reading operation RBP and the sensing data of the first post-exposure reading operation RP performed on the p-type transistor PT. In some embodiments, the method M may further include a comparison step performed to compare the sensing data obtained from the post-exposure reading operation RP with the initial data obtained from the pre-exposure reading operation RBP. The comparison may include calculating a difference between the sensing data obtained from the post-exposure reading operation RP and the initial data obtained from the pre-exposure reading operation RBP. In some embodiments, the adjustment of characteristics of the external energy/substance can be determined according to a comparison result (e.g., the difference) between the sensing data obtained from the post-exposure reading operation RP and the initial data obtained from the pre-exposure reading operation RBP. In some alternative embodiments, the adjustment of characteristics of the external energy/substance can be determined merely according to the sensing data obtained from the post-exposure reading operation RP.

In some embodiments, the method M may further include a calculating step that calculate a level/degree of characteristics of the external energy/substance can be calculated based on the comparison result (e.g., the difference) between the sensing data obtained from the post-exposure reading operation RP and the initial data obtained from the pre-exposure reading operation RBP or merely based on the sensing data of the post-exposure reading operation RP. And, the step S6 of the method M includes adjusting the characteristics of the external energy/substance based on the calculated level/degree of characteristics of the external energy/substance after the calculating step.

Once the sensing of the p-type transistor saturates, the method M1 proceeds to step S7, where the characteristics of the external energy/substance is adjusted based on the initial data of the second pre-exposure reading operation RBN and the sensing data of the second post-exposure reading operation RN performed on the n-type transistor NT. In some embodiments, the method M may further include a comparison step performed to compare the sensing data obtained from the post-exposure reading operation RN with the initial data obtained from the pre-exposure reading operation RBN. The comparison may include calculating a difference between the sensing data obtained from the post-exposure reading operation RN and the initial data obtained from the pre-exposure reading operation RBN. In some embodiments, the adjustment of characteristics of the external energy/substance can be determined according to a comparison result (e.g., the difference) between the sensing data obtained from the post-exposure reading operation RN and the initial data obtained from the pre-exposure reading operation RBN. In some alternative embodiments, the adjustment of characteristics of the external energy/substance can be determined merely according to the sensing data obtained from the post-exposure reading operation RN.

In some embodiments, the method M may further include a calculating step that calculate a level/degree of characteristics of the external energy/substance can be calculated based on the comparison result (e.g., the difference) between the sensing data obtained from the post-exposure reading operation RN and the initial data obtained from the pre-exposure reading operation RBN or merely based on the sensing data of the post-exposure reading operation RN. And, the step S7 of the method M includes adjusting the characteristics of the external energy/substance based on the calculated level/degree of characteristics of the external energy/substance after the calculating step.

The p-type transistor PT and n-type transistor NT may have their own different sensing ranges corresponding to the amounts of electron on the gates of the p-type transistor PT and n-type transistor NT. The determination of the saturation sensing of the p-type transistor PT indicates that little electrons remains on the gates of the p-type transistor PT and n-type transistor NT, such that the p-type transistor PT turn off, while the n-type transistor NT turn on. As a result, with the configuration of the n-type transistor NT, the sensing range of the p-type transistor PT can be compensated by the n-type transistor NT, thereby widening the sensing range of the detection unit 100.

In some embodiments, at step S6 and S7, if the difference between the initial data of the pre-exposure reading operation RBP/RBN and the sensing data of the post-exposure reading operation RP/RN (or the sensing data of the post-exposure reading operation RP/RN or the calculated level/degree of characteristics of the external energy/substance) is not fully satisfactory, the adjustment to the characteristics of the external energy/substance is performed. The operator or a controller may change parameters of components of the apparatus (e.g., EUV exposure apparatus 910 in FIG. 4A, e-beam exposure apparatus 920 in FIG. 5A, gas supplying system 930, plasma generator 940, solution providing system 950 in FIG. 6A) for adjusting the characteristics of the external energy/substance according to the difference between the initial data of the pre-exposure reading operation RBP/RBN and the sensing data of the post-exposure reading operation RP/RN (or the sensing data of the post-exposure reading operation RP/RN or the calculated level/degree of characteristics of the external energy/substance is not fully satisfactory).

For example, in some embodiments of the EUV light or e-beam (later illustrated in FIGS. 4A and 5A), it is determined as not satisfactory if the difference between the initial data of the pre-exposure reading operation RBP/RBN and the sensing data of the post-exposure reading operation RP/RN (or the sensing data of the post-exposure reading operation RP/RN or the calculated level/degree of characteristics of the external energy/substance) in a dark region indicates an intensity greater than a threshold value at which the photoresist becomes developable; and it is determined as satisfactory if the difference between the initial data of the pre-exposure reading operation RBP/RBN and the sensing data of the post-exposure reading operation RP/RN (or the sensing data of the post-exposure reading operation RP/RN or the calculated level/degree of characteristics of the external energy/substance) in a dark region indicates an intensity less than the threshold value at which the photoresist becomes developable. On the other hand, it may be determined as not satisfactory if the difference between the initial data of the pre-exposure reading operation RBP/RBN and the sensing data of the post-exposure reading operation RP/RN (or the sensing data of the post-exposure reading operation RP/RN or the calculated level/degree of characteristics of the external energy/substance) in a bright region indicates an intensity less than the threshold value at which the photoresist becomes developable; and it may be determined as satisfactory if the difference between the initial data of the pre-exposure reading operation RBP/RBN and the sensing data of the post-exposure reading operation RP/RN (or the sensing data of the post-exposure reading operation RP/RN or the calculated level/degree of characteristics of the external energy/substance) in the bright region indicates an intensity greater than the threshold value at which the photoresist becomes developable.

In some embodiments, with the configuration of the arrayed detection units 100, the level/degree of characteristics of the external energy/substance can be calculated at plural regions can be obtained as a two-dimensional spatial distribution, such as images. In some embodiments, at step S6 and S7, if the calculated two-dimensional spatial distributions is not fully satisfactory, the operator or a controller may change parameters of components of the apparatus (e.g., EUV exposure apparatus 910 in FIG. 4A, e-beam exposure apparatus 920 in FIG. 5A, gas supplying system 930, plasma generator 940, solution providing system 950 in FIG. 6A) for adjusting the distributions of the level/degree of characteristics of the external energy/substance at the regions according to the calculated two-dimensional spatial distribution. For example, in some embodiments of the EUV light/e-beam or the gas mixture/plasma/ions, it is determined as not satisfactory if a uniformity of the calculated two-dimensional spatial distribution of intensity/concentrations at plural regions is less than a threshold value, for example, in a range from about 10% to about 90%; and it is determined as satisfactory if a uniformity of the calculated two-dimensional spatial distribution of intensity/concentrations at the plural regions is greater than the threshold value.

Figure 4A:
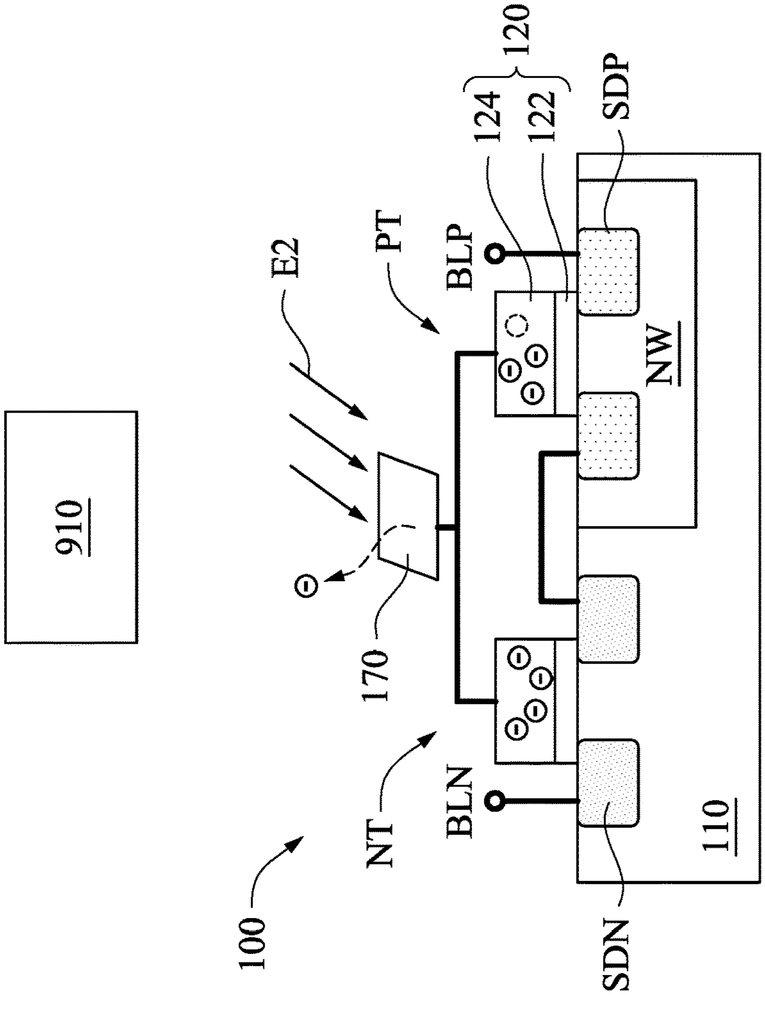
FIG. 4A is a schematic cross-sectional view illustrating an exemplary detection unit at an energy exposure operation for EUV/DUV light according to some embodiments of the present disclosure.

FIG. 4A is a schematic cross-sectional view illustrating an exemplary detection unit 100 at an energy exposure operation for EUV/DUV light E1 according to some embodiments of the present disclosure. For light detection, the energy sensing pad 170 may include a metal that that shows photoelectric effect with the lights. Photoelectric effect is referred to a phenomenon that electrical charges (e.g., electrons) can be ejected from the surface of a metal when light shines on the metal. The metal of the energy sensing pad 170 may be chosen based on the wavelength of the light to be detected. For example, the energy sensing pad 170 may has a work function between about 3.5 eV to about 6.5 eV for detecting EUV/DUV light E1.

In some embodiments, the energy sensing pad 170 is made of copper, which has a work function of about 4.65 eV. Hence, when the energy sensing pad 170 is illuminated with light of wavelength less than about 267 nanometers, the electrons would leave due to the photoelectric effect. Since the energy sensing pad 170 is connected to the floating gate electrodes 124 of the n-type transistor NT and the p-type transistor PT, it can directly affect the amount of charge in the floating gate electrodes 124. In some alternative embodiments, the energy sensing pad 170 is made of platinum. In such embodiments, when the energy sensing pad 170 is illuminated with light of wavelength less than about 220 nanometers, electrons would leave the platinum energy sensing pad 170 due to the photoelectric effect. In some alternative embodiments, the energy sensing pad 170 is made of aluminum. In such embodiments, when the energy sensing pad 170 is illuminated with light of wavelength less than about 296 nanometers, electrons would leave the aluminum energy sensing pad 170 due to the photoelectric effect. In some alternative embodiments, the energy sensing pad 170 is made of magnesium. In such embodiments, when the energy sensing pad 170 is illuminated with light of wavelength less than about 337 nanometers, electrons would leave the magnesium energy sensing pad 170 due to the photoelectric effect. In FIG. 4A, a EUV/DUV exposure apparatus 910 is also illustrated for generating the EUV/DUV light E1 used in lithography process.

Figure 4B:
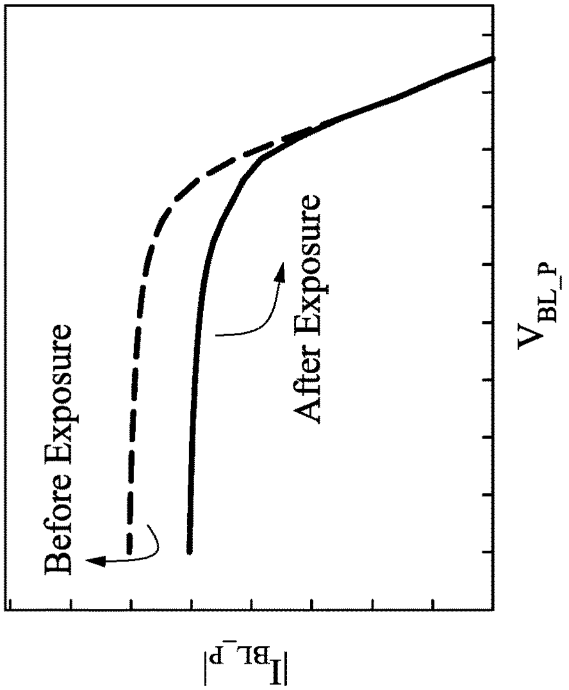
FIG. 4B is a plot of I-V characteristics measured through a bit line connected to a p-type transistor in an exemplary detection unit before and after the energy exposure operation for EUV/DUV light.

FIG. 4B is a plot of I-V characteristics measured through a bit line BLP connected to a p-type transistor PT in an exemplary detection unit 100 before and after the energy exposure operation for EUV/DUV light. After the initialization operation INS (referring to FIG. 3), the gate of the p-type transistor PT is full of electrons. When detection unit 100 is under the exposure of EUV/DUV light, the stored electrons gains enough energy from the EUV/DUV light and can escape from the gate of the p-type transistor PT, for example, into dielectric material in the MLI structure 160. Thus, during this energy exposure operation, the stored electrons are removed or erased without any battery or power. The amount of escaped charges will be proportional to light intensity and exposure time, and can be determined by measuring $V_T$ of the p-type transistor PT before and after exposure In absence of the n-type transistor NT, for p-type transistor PT, with more exposure, since the stored electrons escapes more, the p-type transistor PT turn off, and the change of the I-V curve will gradually saturate. The I-V curve ill move less in response to more exposure, which making the change in I-V curve becomes difficult to observe.

Figure 4C:
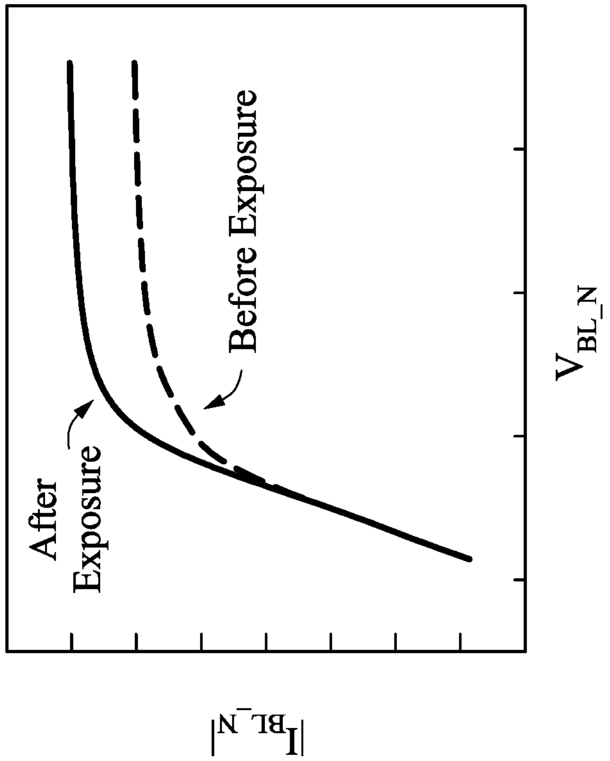
FIG. 4C is a plot of I-V characteristics measured through a bit line connected to an n-type transistor in an exemplary detection unit before and after the energy exposure operation for EUV/DUV light.

FIG. 4C is a plot of I-V characteristics measured through a bit line BLN connected to an n-type transistor NT in an exemplary detection unit 100 before and after the energy exposure operation for EUV/DUV light. For n-type transistor NT, with the more exposure, the n-type transistor NT turn on, the I-V curve an move upward without decreasing the amount of movement. Therefore, the operable sensing range of the detection device 10 can be greatly enlarged.

As a result, for enlarging the operable sensing range of the detection device 10, it is beneficial to determine a level/degree of characteristics of the external energy/substance according to both the sensing data obtained from the post-exposure reading operation RP (referring to FIG. 3) and the sensing data obtained from the energy/substance exposure operation RN (referring to FIG. 3), or a comparison result between the sensing data obtained from the post-exposure reading operation RP (referring to FIG. 3) and the initial data obtained from the pre-exposure reading operation RBP (referring to FIG. 3) and a comparison result between the sensing data obtained from the energy/substance exposure operation RN (referring to FIG. 3) and the initial data obtained from the pre-exposure reading operation RBN (referring to FIG. 3).

Figure 5B:
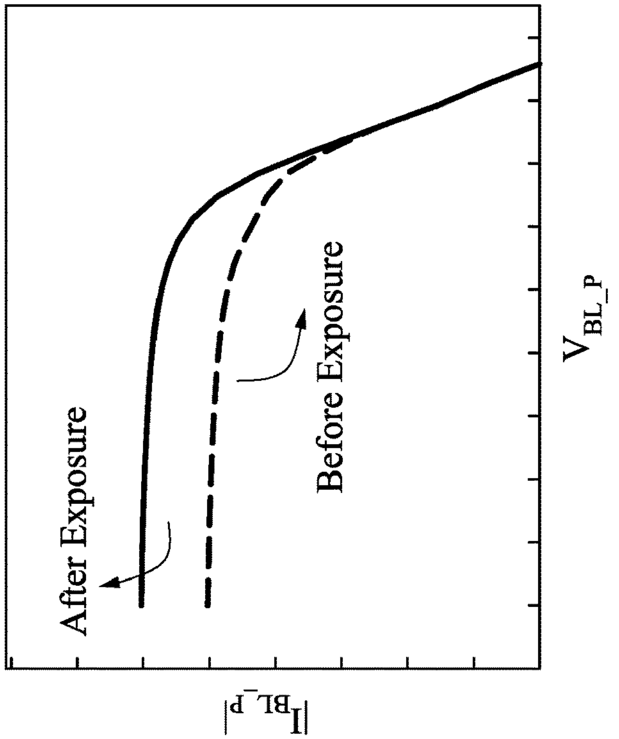
FIG. 5B is a plot of I-V characteristics measured through a bit line connected to a p-type transistor in an exemplary detection unit before and after the energy exposure operation for e-beam.
Figure 5A:
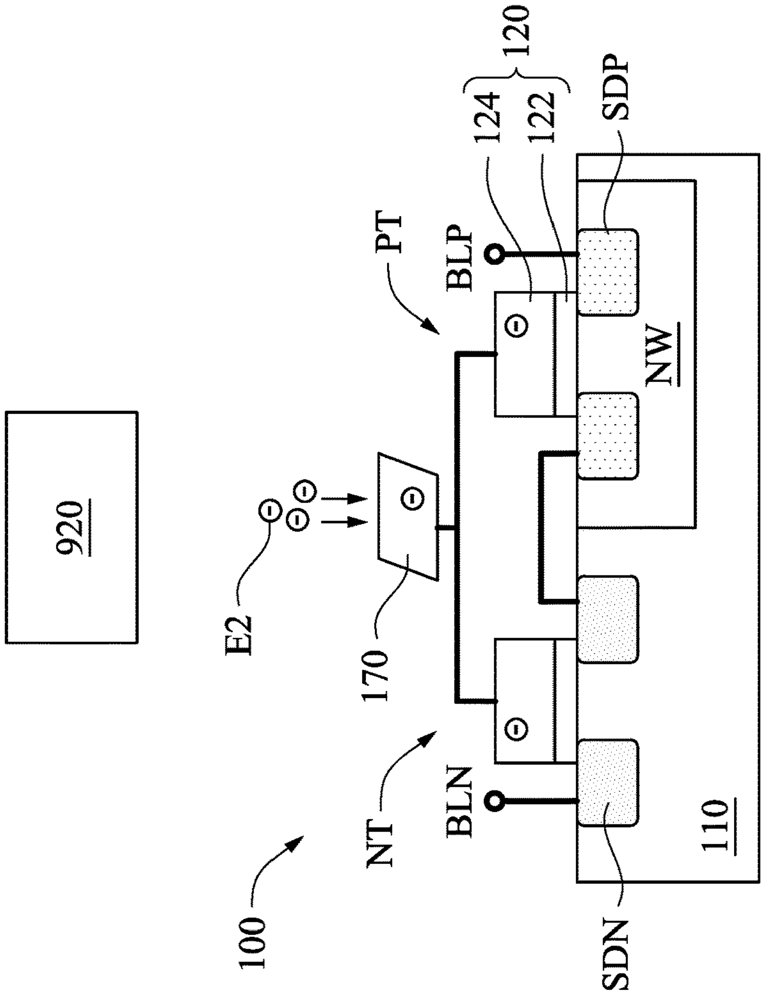
FIG. 5A is a schematic cross-sectional view illustrating an exemplary detection unit at an energy exposure operation for e-beam according to some embodiments of the present disclosure.

FIG. 5A is a schematic cross-sectional view illustrating an exemplary detection unit 100 at an energy exposure operation for e-beam E2 according to some embodiments of the present disclosure. In FIG. 5A, a e-beam exposure apparatus 920 is also illustrated for generating the e-beam E2 used in lithography process. FIG. 5B is a plot of I-V characteristics measured through a bit line connected to a p-type transistor in an exemplary detection unit before and after the energy exposure operation for e-beam. When electrons from the e-beam are projected onto an empty or neutral floating gate electrode 124, the electrons collected by the floating gate electrodes 124, thereby leading $V_T$ shift in the corresponding detection unit 100. Similarly, the quantified threshold voltage ($V_T$) change will reflect the intensity and exposure time, and can be readout under off-line measurement (like wafer acceptance test (WAT)).

Figure 6A:
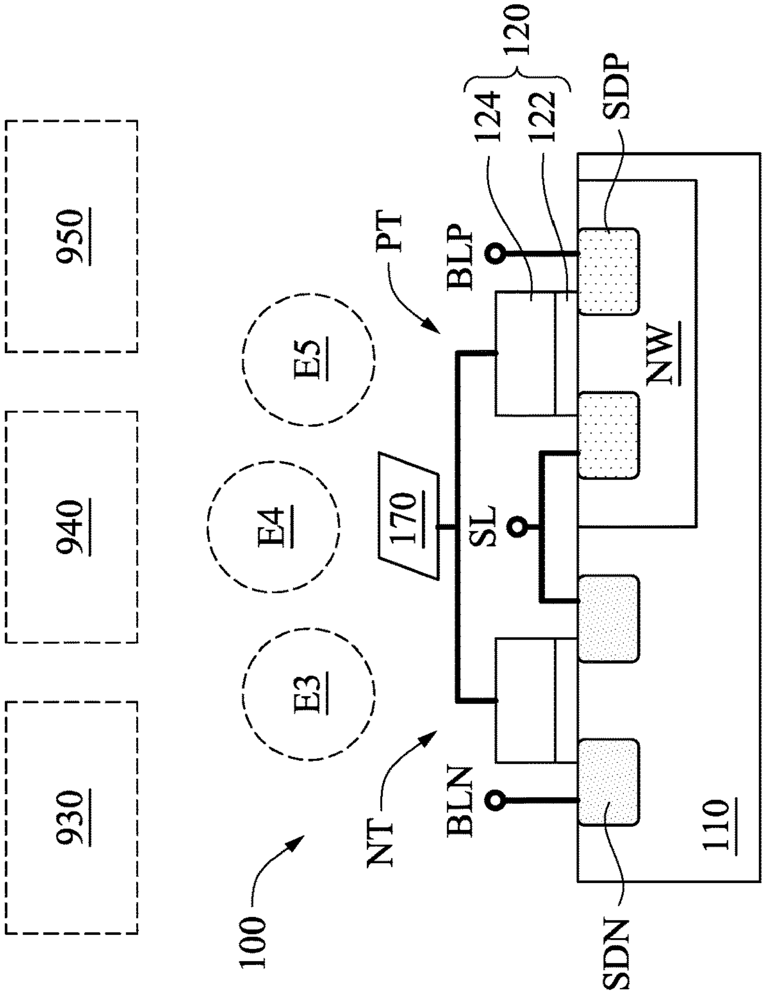
FIG. 6A is a schematic cross-sectional view illustrating an exemplary detection unit at a substance exposure operation for gas, plasma, and/or ions according to some embodiments of the present disclosure.

FIG. 6A is a schematic cross-sectional view illustrating an exemplary detection unit at a substance exposure operation for gas mixture E3, plasma E4, and/or ions E5 according to some embodiments of the present disclosure. The size, structure, and design of the energy sensing pad 170 can vary as required for different applications. In FIG. 6A, a gas supplying system 930 is also illustrated for supplying the gas mixture E3; a plasma generator 940 is also illustrated for generating the plasma E4; and the solution providing system 950 is also illustrated for providing the solution containing the ions E5.

Figure 6B:
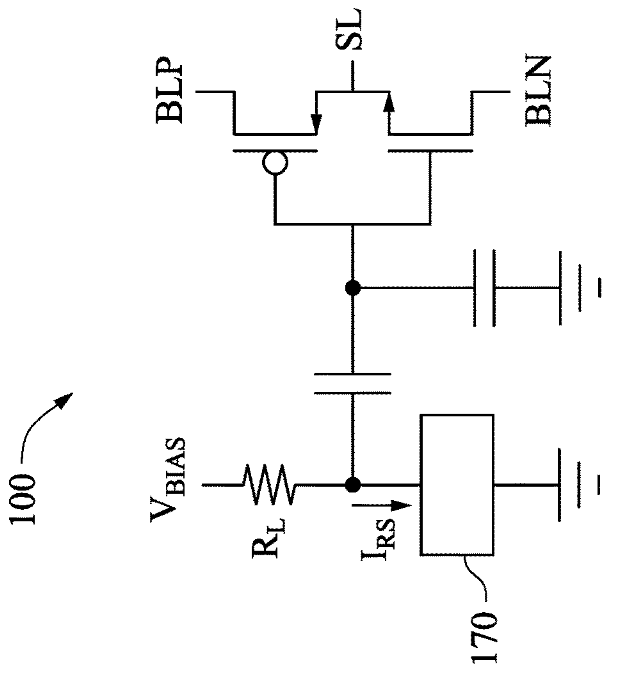
FIG. 6B is a circuit diagram of a detection unit for detecting gas according to some embodiments of the present disclosure.

In some embodiments, the energy sensing pad 170 can be exposed to the gas mixture E3 for gas sensing. In such embodiments, the energy sensing pad 170 may be a sensing film include a resistance-variable material, which has a resistance vary according to the concentration of gas. For example, the sensing film is made of $SnSe_2$. FIG. 6B is a circuit diagram of a detection unit 100 for detecting gas mixture E3 according to some embodiments of the present disclosure. The energy sensing pad 170 is series connected with a reference resistance, between a bias voltage VBIAS and a ground potential. By the resistance-variable material, the voltage on the gates of the n-type transistor NT and the p-type transistor PT would vary with the gas concentration. When the resistance of the energy sensing pad 170 changes according to the gas concentration, the voltage of the gates of the n-type transistor NT and the p-type transistor PT would vary. Therefore, reading a current flowing through the n-type transistor NT and the p-type transistor PT would reveal the gas concentration.

In some embodiments, the energy sensing pad 170 can be exposed to the plasma E4 for plasma sensing. In such embodiments, the energy sensing pad 170 may include a sensing film made of copper. When sensing the plasma E4, the size of the energy sensing pad 170 can be adjusted to change the amount of charge collected. By collecting charge through the energy sensing pad 170 and gate electrodes 124, it is capable of measuring the plasma charging inductive charge caused by the charging damage effect during the plasma process. For plasma sensing, the energy sensing pad 170 may be floating (e.g., the circuit in FIG. 1A) or supplied with a bias voltage series connected with a reference resistance, between a bias voltage VBIAS and a ground potential (e.g., the circuit in FIG. 6B).

Figure 6C:
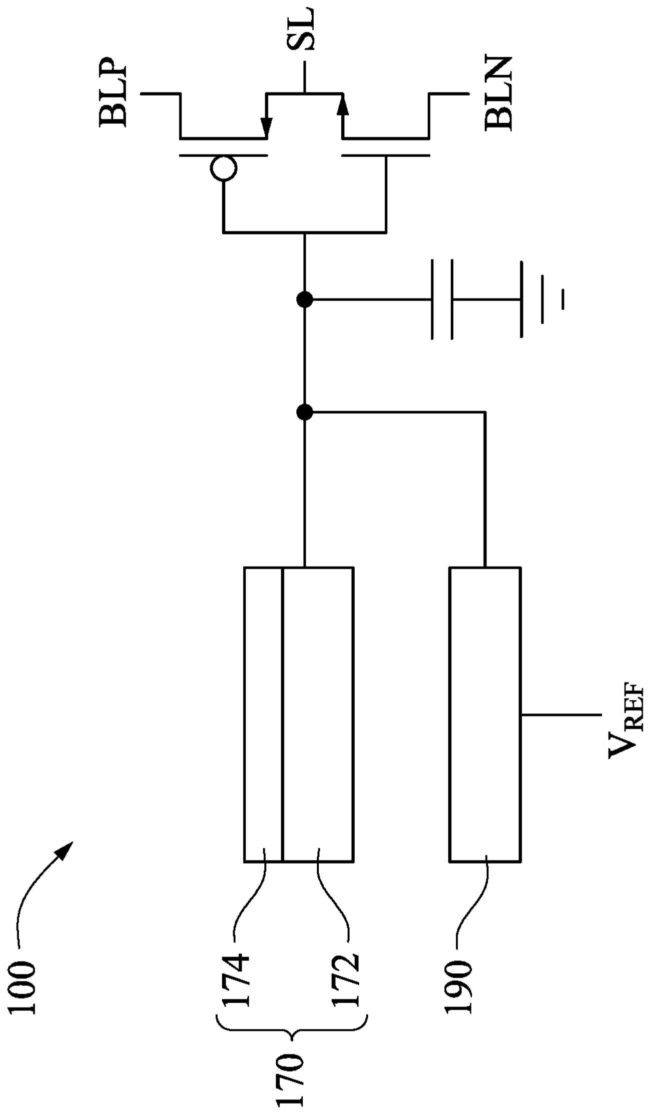
FIG. 6C is a circuit diagram of a detection unit for detecting ions in a solution according to some embodiments of the present disclosure.

In some embodiments, the energy sensing pad 170 can used for ion sensing. FIG. 6C is a circuit diagram of a detection unit 100 for detecting ions in a solution according to some embodiments of the present disclosure. In such embodiments, the energy sensing pad 170 may include a conductive electrode 172 and a dielectric sensing film 174 may be formed on the conductive electrode 172. The conductive electrode 172 is coupled with the floating gate electrodes 124 of the n-type transistor NT and the p-type transistor PT. The dielectric sensing film 174 is exposed to the ions E5. The dielectric sensing film 174 can be a silicon oxide film or an aluminum oxide film. A reference conductive electrode 190 connected with a reference potential is also coupled with the floating gate electrodes 124 of the n-type transistor NT and the p-type transistor PT. By using sensing film 174 to chemically react with ions, and integrating with the reference electrode 190 into the structure, the ion concentration in the solution can be measured through the charge stored in the floating gate electrodes 124 of the n-type transistor NT and the p-type transistor PT.

Figure 7:
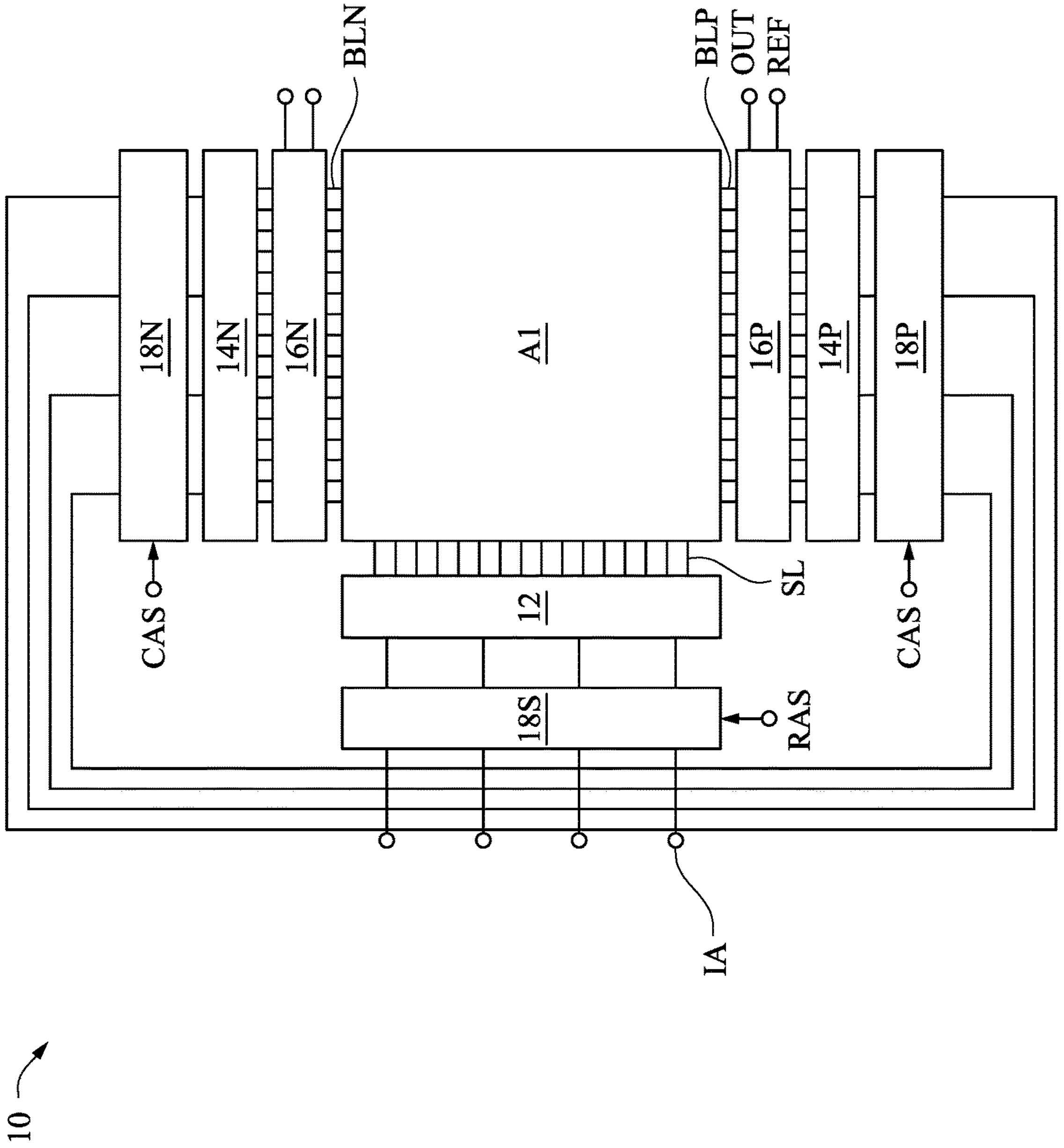
FIG. 7 is a block diagram of a detection device according to some embodiments of the present disclosure.

FIG. 7 is a block diagram of a detection device 10 according to some embodiments of the present disclosure. A layout design for a compact detection device 10 is shown. The detection device 10 may include a pixel array A1, bit lines BLP and BLN, source lines SL, a row decoder 12, column decoders 14P and 14N, multiplexers 16P and 16N, address buffer 18S, 18P, and 18N, a row address strobe RAS, a column address strobe CAS.

The array A1 may include a plurality of pixels, each of the pixels corresponds to a detection unit 100 (referring to FIGS. 1A and 1B). The bit lines BLP and BLN and the source lines SL may correspond to the bit lines BLP0-BLP3, the bit lines BLN0-BLN3, and the source lines SL0-SL3 (referring to FIGS. 1A and 1B), respectively. The pixels of the array A1 are electrically connected with the bit lines BLP and BLN and the source lines SL. The address buffer 18S, 18P, and 18N receives signals from input address nodes IA. The row decoder 12 is electrically connected between the source lines SL and the address buffer 18S, which is provided with the row address strobe RAS. The column decoder 14P is electrically connected between the bit lines BLP and the address buffer 18P, which is provided with the column address strobe CAS. The column decoder 14N is electrically connected between the bit lines BLN and the address buffer 18N, which is provided with the column address strobe CAS. The multiplexer 16P is respectively connected between the column decoder 14P and the bit lines BLP, and the multiplexer 16N is respectively connected between the column decoder 14N and the bit lines BLN. In some embodiments, sensing output nodes OUT may be electrically connected with the multiplexers 16P and 16N. In some embodiment, the detection device 10 may further include reference cells REF connected with the multiplexers 16P and 16N.

With the layout design, the initialization operation INS and the reading operations RP, RN, RBP, RBN (referring to FIG. 3) can be performed to each pixel of the array A1. In some embodiments, by integrating with peripheral circuits such as sense amplifiers and decoders, it is able to amplify the signals generated by the components or control the on/off of specific cells, allowing the array to drive other circuits and provide more applications.

The controller for change parameters of components of the apparatus may include a computer-readable storage medium and a processor coupled to the computer-readable storage medium. The computer-readable storage medium stores program that performs the steps of the method M (referring to FIG. 2). The controller performs various the steps of the method M by using the processor reading out and executing the program stored in the storage medium, for example, the processor may send signals/commends as the input address nodes IA to the address buffer 18S, 18P, and 18N, thereby controlling the row decoder 12 and the column decoders 14P and 14N. The program may be one that has been stored in the computer-readable storage medium, or may be one that has been installed to the storage medium of the controller.

Figure 8:
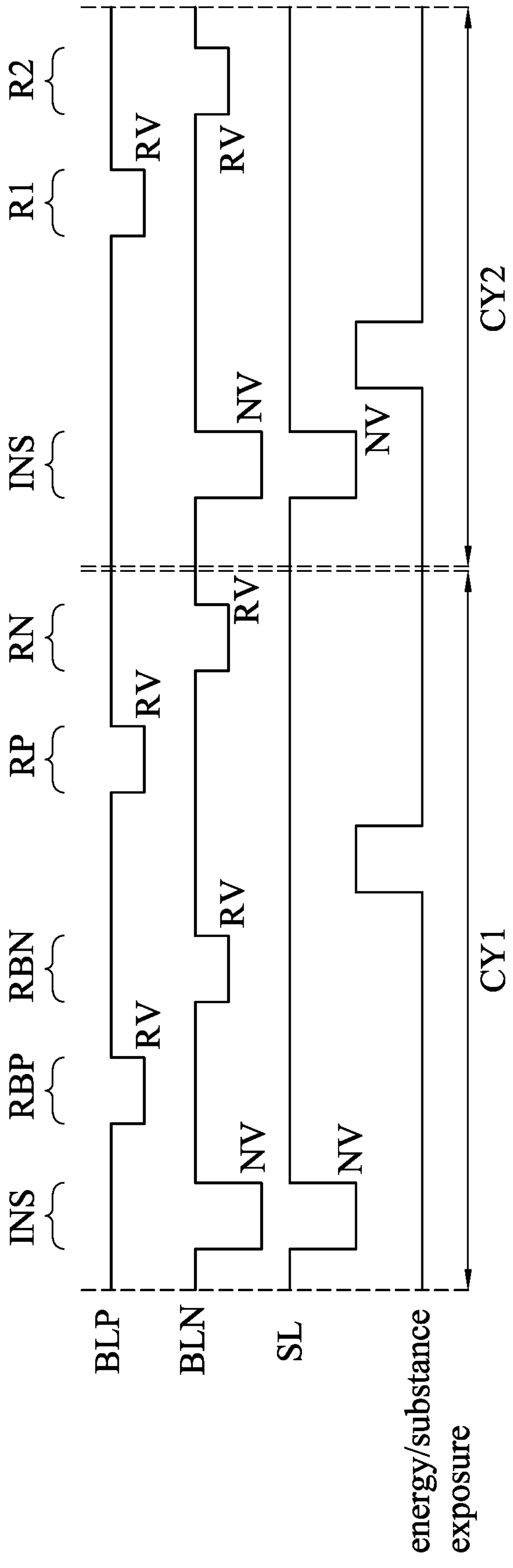
FIG. 8 is a signal sequence diagram for operating a detection unit according to some embodiments of the present disclosure.

FIG. 8 is a signal sequence diagram for operating a detection unit according to some embodiments of the present disclosure. Details of the present embodiments are similar to those of FIG. 3, except that the initialization operation INS includes charging the first source/drain node of the p-type transistor PT (i.e., the bit line BLP) and the well region NW to about 0V (i.e., ground (GND)), and applying a negative voltage NV to the first source/drain node of the n-type transistor NT (i.e., the bit line BLN) and second source/drain nodes of the n-type transistor NT and the p-type transistor PT (i.e., the source line SL). Thorough the configuration, a high potential difference is provided across the p-type transistor PT. Through the initialization operation, a channel hot hole induced hot electron injection (CHHIHEL) effect occurs and electrons are injected into the gate of the p-type transistor PT. The electrons in the gate of the p-type transistor PT will be used to detect energy (e.g., light/e-beam) or substance in the detecting cycle. Other details of the present embodiments are similar to those illustrated in the embodiments of FIG. 2, and therefore not repeated herein.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that a detector including a n-type transistor and a p-type transistor is designed to detect and record the intensity and spatial distributions of EUV, DUV and e-beam projected on a wafer, and the detector features wide sensing range and full-compatibility with CMOS logic process. Another advantage is that the detector is designed with selectivity in wavelength of target sensing light or selectivity in concentration of the target sensing substance. Still another advantage is that the detector is designed with as a compact complementary 2-transistor (2T) pixel for higher spatial resolution. Still another advantage is that the detector can be completely battery-less and powerless when sensing and recording EUV/DUV/e-beam signal. Still another advantage is that the data can be readout by in-line WAT for timely feedback to the optimization of scanner settings.

According to some embodiments, a method includes directing an exposure energy of an exposure apparatus to a detection device, wherein the detection device comprises a plurality of detection units, each of the detection units comprises a n-type transistor, a p-type transistor, and an energy sensing pad coupled with gates of the n-type transistor and the p-type transistor; performing a first post-exposure reading operation on the p-type transistor of one of the detection units; and performing a second post-exposure reading operation on the n-type transistor of said one of the detection units.

According to some embodiments, a method includes providing a detection device comprising a plurality of detection units, wherein each of the detection units comprises a n-type transistor, a p-type transistor, and an energy sensing pad coupled with gates of the n-type transistor and the p-type transistor; exposing the energy sensing pads of the detection units to a substance; performing a first post-exposure reading operation on the p-type transistor of one of the detection units; and performing a second post-exposure reading operation on the n-type transistor of said one of the detection units.

According to some embodiments, a detection device includes at least one detection unit, a source line, a first bit line, and a second bit line. The detection unit comprises a n-type transistor, a p-type transistor, and an energy sensing pad. Each of the n-type transistor and the p-type transistor comprises a gate electrode, a first source/drain node, and a second source/drain node. The energy sensing pad is coupled to the gate electrode of the n-type transistor and the gate electrode of the p-type transistor. The source line is coupled with the first source/drain node of the n-type transistor and the first source/drain node of the p-type transistor of the detection unit. The first bit line is coupled with the second source/drain node of the p-type transistor of the detection unit. The second bit line is coupled with the second source/drain node of the n-type transistor of the detection unit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

directing an exposure energy of an exposure apparatus to a detection device, wherein the detection device comprises a plurality of detection units, each of the plurality of detection units comprises an n-type transistor, a p-type transistor, and an energy sensing pad coupled with gates of the n-type transistor and the p-type transistor;

performing a first post-exposure reading operation on the p-type transistor of one of the plurality of detection units; and performing a second post-exposure reading operation on the n-type transistor of the one of the plurality of detection units.

2. The method of claim 1, further comprising:

adjusting the exposure apparatus according to one of data of the first post-exposure reading operation and data of the second post-exposure reading operation.

3. The method of claim 1, wherein the energy sensing pad and the gates of the n-type transistor and the p-type transistor are electrically floating.

4. The method of claim 1, further comprising:

performing an initialization operation prior to directing the exposure energy of the exposure apparatus to the detection device, wherein the initialization operation comprises providing a potential difference between two source/drain nodes of the p-type transistor of the one of the plurality of detection units.

5. The method of claim 4, further comprising:

performing a first pre-exposure reading operation on the p-type transistor of the one of the plurality of detection units after the initialization operation;

comparing data of the first pre-exposure reading operation with data of the first post-exposure reading operation; and adjusting the exposure apparatus according to a comparison result between the data of the first pre-exposure reading operation and the data of the first post-exposure reading operation.

6. The method of claim 4, further comprising:

performing a second pre-exposure reading operation on the n-type transistor of the one of the plurality of detection units after the initialization operation;

comparing data of the second pre-exposure reading operation with data of the second post-exposure reading operation; and adjusting the exposure apparatus according to a comparison result between the data of the second pre-exposure reading operation and the data of the second post-exposure reading operation.

7. The method of claim 4, wherein an absolute value of the potential difference between the two source/drain nodes of the p-type transistor provided by the initialization operation is greater than an absolute value of a reading potential difference between the two source/drain nodes of the p-type transistor provided by the first post-exposure reading operation.

8. A method, comprising:

providing a detection device comprising a plurality of detection units, wherein each of the plurality of detection units comprises an n-type transistor, a p-type transistor, and an energy sensing pad coupled with gates of the n-type transistor and the p-type transistor;

exposing energy sensing pads of the plurality of detection units to a substance;

performing a first post-exposure reading operation on the p-type transistor of one of the plurality of detection units; and performing a second post-exposure reading operation on the n-type transistor of the one of the plurality of detection units.

9. The method of claim 8, further comprising:

adjusting a distribution of the substance according to one of data of the first post-exposure reading operation and data of the second post-exposure reading operation.

10. The method of claim 8, wherein the substance is a gas mixture, a plasma, or ions in a solution.

11. The method of claim 8, further comprising:

supplying a bias voltage to the energy sensing pad of the one of the plurality of detection units when exposing the energy sensing pads of the plurality of detection units to the substance.

12. The method of claim 8, wherein the energy sensing pad and the gates of the n-type transistor and the p-type transistor are electrically floating when exposing the energy sensing pads of the plurality of detection units to the substance.

13. A detection device, comprising:

at least one detection unit, wherein the at least one detection unit comprises:

an n-type transistor and a p-type transistor, wherein each of the n-type transistor and the p-type transistor comprises a gate electrode, a first source/drain node, and a second source/drain node; and an energy sensing pad coupled to the gate electrode of the n-type transistor and the gate electrode of the p-type transistor;

a source line coupled with the first source/drain node of the n-type transistor and the first source/drain node of the p-type transistor of the at least one detection unit;

a first bit line coupled with the second source/drain node of the p-type transistor of the at least one detection unit; and a second bit line coupled with the second source/drain node of the n-type transistor of the at least one detection unit.

14. The detection device of claim 13, further comprising:

an interconnect structure over the n-type transistor and the p-type transistor, wherein the interconnect structure comprises a plurality of conductive features, and a portion of the plurality of conductive features connects the gate electrode of the n-type transistor and the gate electrode of the p-type transistor to the energy sensing pad.

15. The detection device of claim 14, wherein the energy sensing pad is exposed from the interconnect structure.

16. The detection device of claim 14, wherein a material of the energy sensing pad is different from a material of the plurality of conductive features.

17. The detection device of claim 14, wherein the energy sensing pad is higher than the plurality of conductive features along a direction perpendicular to a top surface of the gate electrode of the n-type transistor.

18. The detection device of claim 13, wherein the energy sensing pad comprises a metal having a work function between about 3.5 eV to about 6.5 eV.

19. The detection device of claim 13, wherein the energy sensing pad comprises a sensing film made of SnSe2.

20. The detection device of claim 13, wherein the energy sensing pad comprises an electrode and a dielectric sensing film over the electrode.

* * * * *